United States Patent [19]

Pesque et al.

[11] Patent Number: 4,883,060

[45] Date of Patent: Nov. 28, 1989

[54] DEVICE FOR ELIMINATING FIXED ECHOES FOR AN ULTRASONIC ECHOGRAPH

[75] Inventors: Patrick R. Pesque, Perigny; Odile M. A. Bonnefous, Nogent sur Marne, both of France

[73] Assignee: U.S. Philips Corporation, New York, N.Y.

[21] Appl. No.: 215,965

[22] Filed: Jul. 6, 1988

[30] Foreign Application Priority Data

Jul. 9, 1987 [FR] France .................................. 87 09734

[51] Int. Cl.$^4$ .............................................. A61B 8/06
[52] U.S. Cl. ........................... 128/660.01; 128/661.09
[58] Field of Search ......... 128/660.01, 661.08–661.10; 73/861.25

[56] References Cited

U.S. PATENT DOCUMENTS 4,751,847 6/1988 Katakura et al. .......... 128/661.09 X
4,803,990 2/1989 Bonnefous et al. ............. 128/661.08

OTHER PUBLICATIONS

Seo, Y. "Utrasonic Diagnostic Equipment" Europ. Patent Appln. EP 088/045 publ. Jun. 15, 1983.
Fehr, R. "A New MIT Structure with Inherent A/D Conversion", Conf: Circuit Theory & Design, Lansanne, Switzerland (Sep. 4–8, 1978).

Primary Examiner—F. J. Jaworski
Attorney, Agent, or Firm—Jack E. Haken

[57] ABSTRACT

A device for eliminating fixed echoes for an ultrasonic echograph, comprising a first filter (100) which consists on the one hand of M parallel lines i (i=1, ..., M) which a respective delay (i−1)T, where T is the repetition period of the echograph, and on the other hand of weighting means (101i) for the M lines i, the sum of the coefficients ($a_i$) applied to said lines being zero and, of an adder (102) for the lines i thus delayed and weighted. In accordance with the invention, at least one second filter (200) which has the same structure as and which is dephased by (M−1)T with respect to the first filter (100) is connected parallel to the first filter (100), the pulse response ($h_2(t)$) of the second filter being linked to the pulse response ($h_1(t)$) of the first filter as:

$$h_2(t) = h_1(m-1)T - t).$$

Application: Measurement and imaging of blood flow speeds by ultrasonic echography.

5 Claims, 2 Drawing Sheets

DEVICE FOR ELIMINATING FIXED ECHOES FOR AN ULTRASONIC ECHOGRAPH

The invention relates to a device for eliminating fixed echoes for an ultrasonic echograph, comprising a filter of the type comprising delay lines (referred to hereinafter as "delay-line filter").

The device for eliminating fixed echoes in accordance with the invention can be used particularly attractively for the measurement and imaging of the speeds of blood flows by means of ultrasonic echography.

The general technical problem to be solved in any ultrasonic echograph for the measurement and imaging of the speeds of blood flows is the elimination of the fixed echoes caused by the high reflectivity of the biological tissues (in this case the walls of the vessels) which can exceed the reflectivity of blood (red corpuscules) by as much as 40 dB. Therefore, indispensable before any estimation of the speed profile, the use of a device for eliminating fixed echoes is for a reduction of the dynamics of the signals to be processed and for correct measurement of the flow speeds across an entire section of the vessels, notably the low speeds which occur in the vicinity of the walls of the vessels and which are, therefore, masked by the strong signals from these walls.

A solution to this general technical problem is given, for example in French Patent Application No. 2 580 076 which describes a device for eliminating fixed echoes for an ultrasonic echograph, which device comprises delay-line filter which is in this case composed of a line with a delay of one repetition period in parallel with a line with zero delay. Weighting coefficients, (+1 and −1, respectively are applied to these lines which, after weighting, are added by an adder. The known filter thus forms the difference between the two consecutive echographic lines; this results in principle in a quasi-complete reduction of the echoes produced by the fixed tissues. However, this technique has a major drawback in that the signals corresponding to the low flow speeds are also attenuated. For example, it can be demonstrated that the response of the above filter as a function of the flow speed is such that, for a repetition frequency amounting to 5 kHz and a transmission frequency amounting to 5MHz, a signal corresponding to v=5 cm/s is attenuated by 30 dB.

This makes it difficult or impossible to measure the flow speeds where they are lowest, that is to say near the walls of the vessels. However, it is very important to know these speeds for the study and clinical diagnosis of, for example arteries.

The problem to be solved by the present invention is to provide a device for eliminating fixed echoes for an ultrasonic echograph which device enables a satisfactory estimation to be made of low blood flow speeds, notably in the vicinity of the walls of the vessels. The solution to the described technical problem in accordance with the invention consists in that the device comprises a first filter which consists on the one hand of M parallel lines i (i=1, ..., M) having a respective delay (i−1)T, where T is the repetition period of the echograph, and on the other hand of means for weighting the M lines i, the sum of the coefficients applied to said lines being zero, and of an adder for lines i thus delayed and weighted, at least one second filter which has the same structure as the first filter and which is dephased by (M−1)T with respect to the first filter being connected parallel to the first filter, the impulse response $h_2(t)$ of the second filter being linked to the impulse response $h_1(t)$ of the first filter as:

$$h_2(t) = h_1((M-1)T - t) \qquad (1)$$

It is known that the slope of a filter can be improved in the cut-off zone by increasing its order. When applied to the measurement of speeds by echography, this implies the processing of preferably M lines, instead of two successive echographic lines, by means of a delay-line filter consisting of M parallel lines i with a respective delay (i−1)T. In order to ensure the limination of the fixed echoes, the M lines are weighted by coefficients whose sum is zero. Subsequently all lines are added after which they are processed by a speed estimation circuit by correlation, phase shifting etc. However, using this type of filter it is difficult to obtain a correct measurement of the speed profile of the flow being studied and at the same time a high image rate. If N is the number of lines to be processed (typically, N=16 for the peripheral vessels and N=8 for the heart) and if M lines are used for the filter for eliminating the fixed echoes, in practice only N−M+1 lines will be available for the estimation of the speed; this, in order to maintain the same number of lines to be processed, it would be necessary to reduce the image rate.

The device in accordance with the invention comprises two filters of the order M−1 which have frequency responses having the same amplitude; this is an essential condition for the coupling of the two filters. The relation between the frequency responses $H_1(f)$ and $H_2(f)$ is derived from equation (1):

$$H_2(f) = \bar{H}_1(f) \exp(j2\pi f(M-1)T)$$

so that $$|H_2(f)| = |H_1(f)|.$$

On the other hand, 2(N−M+1) signals are available for estimating the speeds instead of N−M+1 signals. These signals are not completely independent; however, when use is made of a speed estimator with non-linear operation (1 bit correlation, phase shift, ...), the gain will nevertheless be substantial. Thus, without substantially reducing the lines to be processed, and hence without reducing the image rate, a satisfactory estimation will be obtained of the low blood flow speeds.

Embodiments in accordance with the invention will be described in detail hereinafter, by way of example, with reference to the accompanying diagrammatic drawings.

Figure 1:
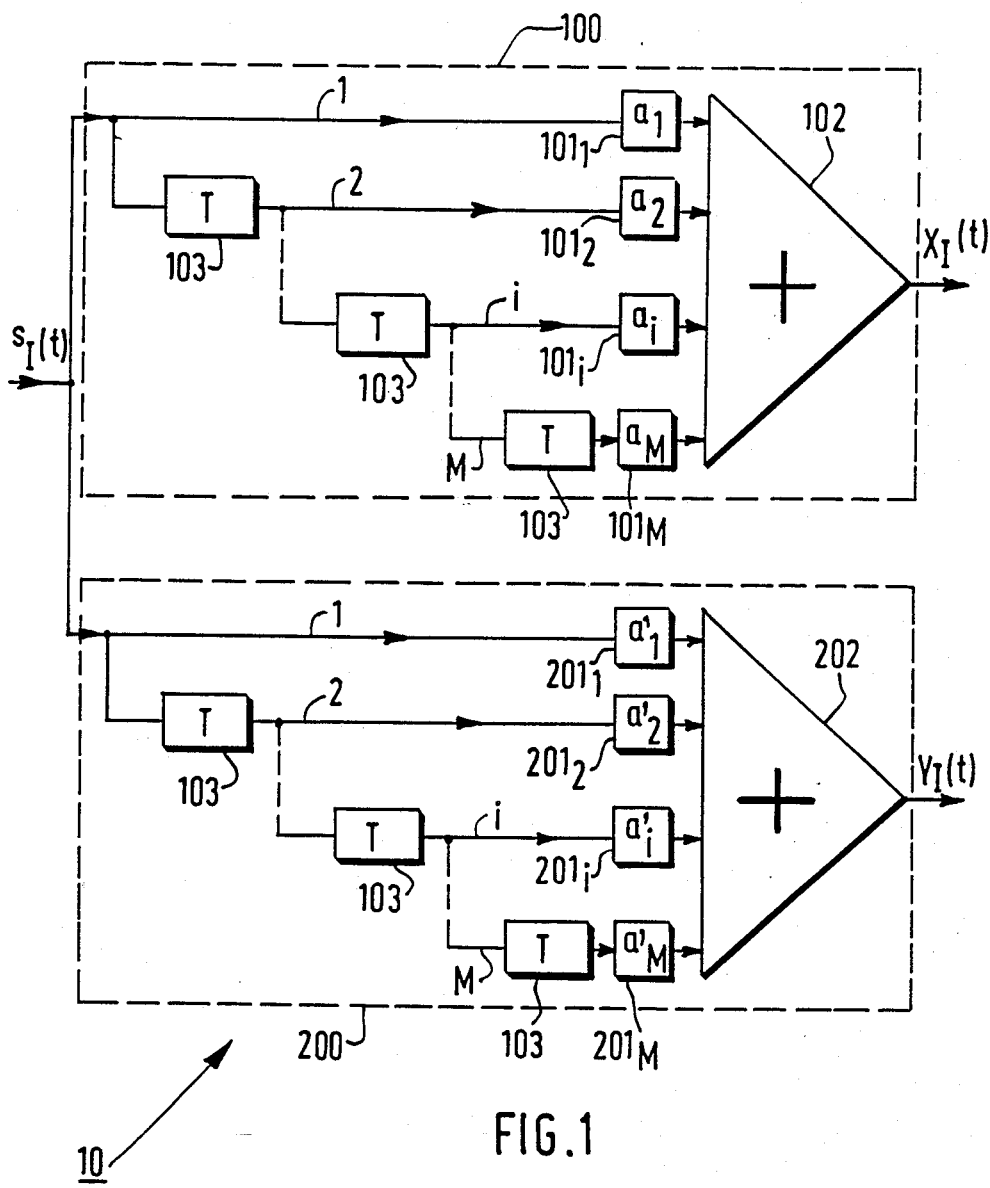
FIG. 1 shows the diagram of a device for eliminating fixed echoes in accordance with the invention.

FIG. 1 shows the diagram of a device 10 for eliminating fixed echoes for an ultrasonic echograph. This device is arranged in general between the receiving circuit for the ultrasonic beam and the speed estimator. As appears from FIG. 1, the device 10 for eliminating fixed echoes comprises a first filter 100 which is composed on the one hand of M lines i (i=1, ..., M) with a respective delay $(i-1)T$, T being the repetition period of the echograph. The delays are obtained by means of delay lines 103. On the other hand, the filter 100 comprises weighting means $101_1, \ldots 101_M$ for the M lines i. In order to ensure the elimination of the fixed echoes, the sum of the coefficients $a_1, \ldots a_M$ applied to said lines by the weighting means $101_1 \ldots 101_M$ is zero:

$$\sum_{i=1}^{M} a_i = 0$$

Finally, an adder 102 forms the sum of the lines i thus delayed and weighted.

The pulse response $h_1(t)$ of the filter 100 is:

$$h_1(t) = \sum_{i=1}^{M} a_i \delta(t - (i-1)T)$$

where $\delta(t)$ is the Dirac impulse function.

The response of the filter 100 to an echographic signal $s_I(t)$ originating from the receiver circuit of the echograph, I being the rank of the corresponding excitation, is thus given by:

$$X_I(t) = \sum_{i=1}^{M} a_i s_{I-(i-1)}(t)$$

Figure 2:
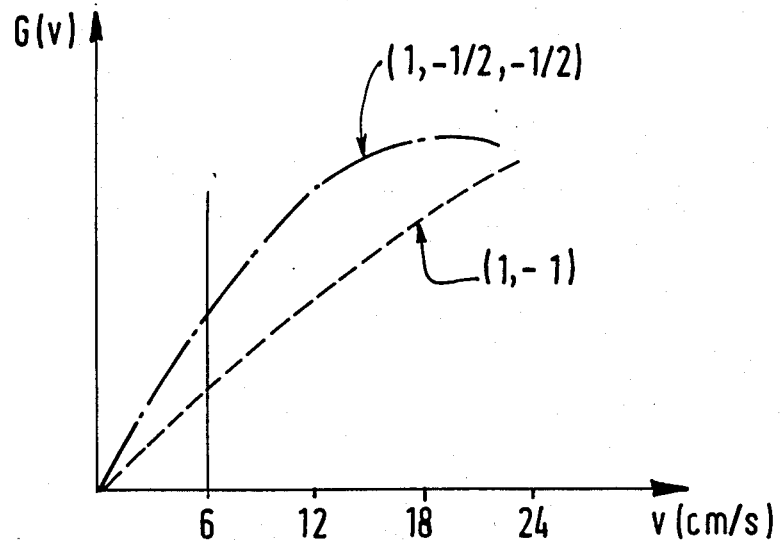
FIG. 2 is the diagram of the speed response of a device, for eliminating fixed echoes at three points.

FIG. 2 shows the speed response G(v) of a filter 100 for which M amounts to 3 and the coefficients $a_1$, $a_2$ and $a_3$ are 1, $-\frac{1}{2}$, $-\frac{1}{2}$, respectively. It appears that this filter has a much higher sensitivity for slow speeds than the corresponding filter of the order 1 for which $a_1 = 1$ and $a_2 = -1$. More specifically for a speed of 6 cm/s the gain in response amounts to 6 dB.

However, it appears that if N successive line to be treated (I=1, ..., N), M are used for the elimination of the fixed echoes and that, consequently, only $N-M+1$ will effectively serve for the estimation of the speed. This either results in a lower accuracy of measurement or necessitates a reduction of the image rate.

As appears from FIG. 1, the device 10 for eliminating fixed echoes also comprises, connected parallel to the first filter 100, a second filter 200 which has the same structure as said first filter 100. The second filter 200 is coupled to the first filter 100 and is dephased by $(M-1)T$, its pulse response $h_2(t)$ being linked to $h_1(t)$ as:

$$h_2(t) = h_1((M-1)T - t) \quad (2)$$

However, because $h_2(t)$ is also given by:

$$h_2(t) = \sum_{i=1}^{M} a'_i \delta(t - (i-1)T)$$

where the coefficients $a'_i$ are the coefficients supplied by the weighting means 201; it appears that there necessarily exists a relation between the coefficients $a_i$ and $a'_i$. For example, if M equals 3:

$$h_1(t) = a_1\delta(t) + a_2\delta(t-T) + a_3\delta(t-2T)$$

$$h_2(t) = a'_1\delta(t) + a'_2\delta(t-T) + a'_3\delta(t-2T)$$

The relation (2) implies:

$a'_2 = a_3$ $a'_2 = a_2$ $a'_3 = a_1$

On the output of the adder 202, the signal supplied by the filter 200 si:

$$Y_I(t) = \sum_{i=1}^{M} a'_i s_{I-(i-1)}(t)$$

The speed response G(v) of the second filter 200 is the same as that of the first filter 100. For the coefficients $a'_1$ and $a'_2$, $a'_3$ which are equal to $-\frac{1}{2}$, $-\frac{1}{2}$, 1, respectively, the response G(v) of the second filter is thus given by the stroke-dot curve in FIG. 2.

When the relation (2) is satisfied, as has been demonstrated above, the two filters 100 and 200 will have frequency responses having the same amplitude response and hence the same energy response.

The device 10 for eliminating fixed echoes in accordance with the invention can thus be considered as a single filter having a speed response and an energy response module which are equal to the common speed response G(v) and the common energy response modulus of the two filters 100 and 200, respectively. The advantage of the device 10 for eliminating fixed echoes as shown in FIG. 1 consists in that it enables the processing of $2(N-M+1)$ lines for estimating the speed instead if the $N-M+1$ lines as would be the case for each of the filters 100 and 200 separately.

It will be apparent, however, that the signals $X_I(t)$ and $Y_I(t)$ from the filters 100 and 200 are not independent because they are formed on the basis of the same input signals $s_I(t)$. However, they are different because of the fact that the weighting coefficients $a_i$ and $a'_i$ are different. In order to take into account this difference, the speed estimator processing the signals $X_I(t)$ and $Y_I(t)$ must use a non-linear operation.

Figure 3:
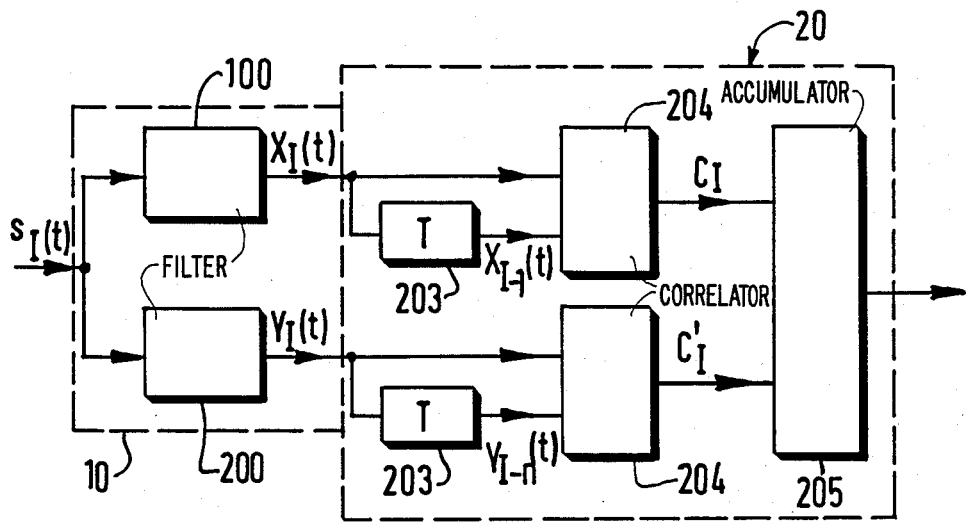
FIG. 3 shows a diagram illustrating the connection of the fixed echo elimination device to a speed estimator.

FIG. 3 shows an example of how the device 10 for eliminating fixed echoes in accordance with the invention can be connected to a speed estimator 20. The signals $X_I(t)$ and $Y_I(t)$ supplied by the filters 100 and 200, respectively, are delayed by a repetition period T by the delay lines 203 so that the successive signals $X_I(t)$, $X_{I-1}(t)$ on the one hand and $Y_I(t)$, $Y_{I-1}(t)$ on the other hand can be processed by the identical circuits 204. These circuits 204 may be correlators which enable the extraction of the correlation functions $C_I$ and $C'_I$. An example of such correlators is given in French Patent Application No. 85 17851 which also shows how the measurement of the correlation functions enables determination of the relevant flow speeds. Finally, these correlation functions $C_I$ and $C'_I$ are accumulated not only over I(I=1, ..., N-M+1) but also between themselves in an accumulator 205 which substantially increases the signal-to-noise ratio of the speed estimator.

Instead of correlators, use can also be made of phase shifters for the circuits 204, the defacing between two echographic lines being a function of the flow speed.

We claim:

1. In an ultrasonic echograph having a pulse repetition period, T, a circuit for eliminating echo signals which represent fixed objects from a stream of echo signals, comprising:

first and second filters, each of said filters including:
M parallel lines connected to apply respective delays $(i-1)T$, where $i=1, \ldots M$, to the stream of echo signals;

an adder; and

M weighting means, each of the weighting means applying signals from a corresponding line to an input of the adder with a respective weighting coefficient $a_i$; and means which combine outputs of the first and second filters;

wherein, in each filter the sum of the weighting factors of the M weighting means is zero;

the phase response of the second filter shifted by $(M-1)T$ with respect to the first filter; and the impulse response of the second filter is $$h_2(t) = h_1((M-1)T - t)$$

where $h_1(t)$ is the impulse response of the first filter.

2. The circuit of claim 1 wherein the means which combine comprise:

first and second velocity determining circuits respectively connected to receive signal outputs from the adders of the first and second filters; and an accumulator connected to receive and accumulate outputs of the first and second velocity determining circuits.

3. The circuit of claim 2 wherein the velocity determining circuits comprise correlators.

4. The circuit of claim 2 wherein the velocity determining circuits comprise phase shifters.

5. The circuit of claim 1 wherein $M=3$, the weighting means have respective weighting coefficients $a_1 = -\frac{1}{2}$, $a_2 = 1$, and $a_3 = \frac{1}{2}$ and the impulse responses of the first and second filters are respectively $$h_1(t) = \delta(t) - \tfrac{1}{2}\delta(t-T) - \tfrac{1}{2}\delta(t-2T)$$

and $$h_2(t) = -\tfrac{1}{2}\delta(t) - \tfrac{1}{2}\delta(t-T) + \delta(t-2T)$$

where $\delta$ is the Dirac impulse function.

* * * * *